United States Patent
Shaw et al.

(10) Patent No.: US 7,115,460 B2
(45) Date of Patent: Oct. 3, 2006

(54) STANDARD CELL BACK BIAS ARCHITECTURE

(75) Inventors: Ching-Hao Shaw, Hsin-Chu (TW);
Chih Hung Wu, Hsin-Chu (TW);
Charlie Chueh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 10/923,490

(22) Filed: Aug. 20, 2004

(65) Prior Publication Data

US 2005/0051801 A1    Mar. 10, 2005

Related U.S. Application Data

(60) Provisional application No. 60/500,121, filed on Sep. 4, 2003.

(51) Int. Cl.
*H01L 21/8238* (2006.01)
(52) U.S. Cl. ............... 438/213; 438/204; 257/E27; 257/108
(58) Field of Classification Search .......... 257/213, 257/192, 197, 202, 203, 204, 205, 288, 356, 257/357, 401, 691
See application file for complete search history.

(56) References Cited

U.S. PATENT DOCUMENTS 5,783,846 A * 7/1998 Baukus et al. ............ 257/204
6,157,070 A * 12/2000 Lin et al. ................. 257/392
6,388,315 B1 * 5/2002 Clark et al. ............... 257/691
6,839,882 B1 * 1/2005 McManus et al. ............ 716/1

OTHER PUBLICATIONS

Tadahiro Kuroda et al., "Substrate Noise Influence on Circuit Performance in Variable Threshold-Voltage Scheme", 1996, pp. 309-312, ISLPED, Monterey, CA, USA, 0-7803-3571-8/96.
Kimiyoshi Usami et al., "Low-power Design Methodology and Application utilizing Dual Supply Voltages", 6 pages.
Tadahira Kuroda et al., A High-Speed Low-Power 0.3um CMOS Gate Array with Variable Threshold Voltage (VT) Scheme, 1996, pp., 53-56, IEEE 1996 Customer Integrated Circuits Conference, 0-7803-3177-6.

* cited by examiner

*Primary Examiner*—David Nhu
(74) *Attorney, Agent, or Firm*—Haynes and Boone, LLP

(57) ABSTRACT

An apparatus including, in one embodiment, a CMOS device cell including at least first and second CMOS transistors having first and second CMOS transistor doped regions in first and second doped wells, respectively, wherein each of the first and second CMOS transistor doped regions is configured to be biased with a corresponding one of a power supply potential and a ground potential. Such an embodiment also includes a tap cell having first and second tap cell doped regions in the first and second doped wells, respectively, wherein each of the first and second tap cell doped regions is configured to be biased with a different potential relative to the power supply and ground potential.

16 Claims, 15 Drawing Sheets

US 7,115,460 B2

STANDARD CELL BACK BIAS ARCHITECTURE

RELATED APPLICATION

The present application is related to and claims the benefit of the priority date of U.S. Provisional Patent Application No. 60/500,121, entitled "STANDARD CELL BACK BIAS ARCHITECTURE," and filed Sep. 4, 2003.

BACKGROUND

Advanced complex semiconductor device design and manufacturing has matured to a high level of quality mandated by the complexity of process steps, device circuit density, and the device minimum feature size. Consequently, many design considerations must be considered in the design of advanced complex semiconductor devices, including power dissipation, timing performance, and leakage power, among others. In response, layout, electrical simulation, and many other related activities have been integrated into full-fledged electronic device design systems. Such electronic design systems enable integrated circuit (IC) designers to fabricate complex structures within a computerized virtual environment, wherein complex three dimensional cells may be constructed, electrically simulated, and matched against manufacturing process capabilities.

However, challenges still exist in designing and maintaining performance of devices, particularly as device dimensions continue to decrease. For example, electrical performance degradation can occur due to the increased density of interconnects and logical devices. To assist in the development of such devices, the layout of developing designs can comprise myriad basic or standard cell-structures that the IC designer can utilize in an electronic design layout system. The myriad standard device cells can include generally employed or frequently used cells comprised of different configurations of field effect transistors (FETS), conductive interconnect configurations, and a plurality of other structures well known by one skilled in the art.

One of the major challenges faced during the development of new designs is the reduction of standby leakage power. Standby leakage power can be associated with any electrical leakage that may occur while an FET or other cell component is not electrically activated. The standby electrical leakage can contribute to degradation in device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
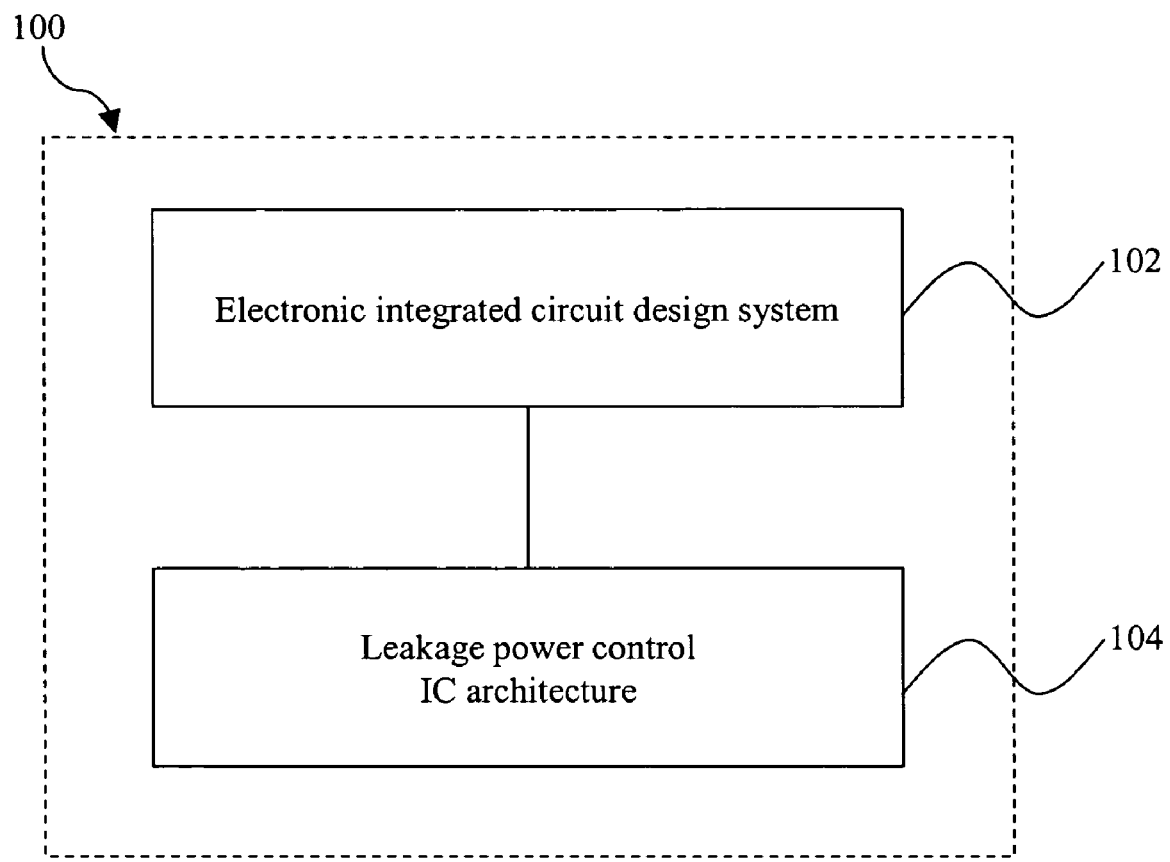
FIG. 1 is a block diagram of at least a portion of one embodiment of a system for providing an energy efficient cell architecture according to aspects of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a block diagram of at least a portion of one embodiment of a system 100 describing two components which may be employed in the establishment of a high energy efficient IC cell structure according to aspects of the present invention. The system 100, or at least the illustrated portion thereof, includes an electronic integrated circuit (IC) design component 102 and a leakage power control IC architecture component 104. The system 100 may further include a plurality of device structures which may be utilized to achieve a highly energy efficient IC cell structure.

The electronic IC design component 102 includes a plurality of electronic software design tools that can be coupled to various databases, such as those of a semiconductor foundry and/or one or more customers of the foundry. For example, the electronic IC design component 102 may include a plurality of device libraries which can be accessed through a graphical user interface, whereby cells from individual device libraries may be placed within an IC design layout. The electronic IC design component 102 may be interconnected to many other entities across a network. The entities can include and are not limited to customers, servers, wireless communication devices, terminals, and a plurality of other networked entities. The network can encompass a virtual fab wherein the electronic IC design component 102, manufacturing operations, and other entities mutually share information, communicate, and interact across the network.

The leakage power control IC architecture component 104 may provide unique design techniques and configurations to the electronic integrated circuit design component 102. The architecture component 104 can provide an IC cell design (and/or plurality thereof) that can significantly reduce the leakage power during device standby and active states. The elements which comprise the IC can be continuously powered by external sources (referred to as "static states"), or randomly fired according to specified operations (referred to as "active states"). An example of an active state element is an FET. In standby mode, many of the FETs of a particular device or apparatus may not be active, although power leakage can still occur.

The architecture component 104 may be employed to provide a back bias for one or more FETs. For example, the architecture component 104 may comprise one or more taps to a well corresponding to one or more FETs, and may also include electrically doped regions wherein an electrical connection may be created to the well containing a plurality of NMOS and/or PMOS devices. In order to implement well voltage biasing, the well can have a floating potential with respect to the substrate and other electrically grounded NMOS and/or PMOS devices. This can allow for voltage biasing of a plurality of cells, which can help to provide control or reduction of leakage current. Well voltage biasing can further provide control of the threshold voltage of the FETs, metal oxide semiconductor FETs (MOSFETs), and/or other devices formed in/on a substrate.

Figure 2:
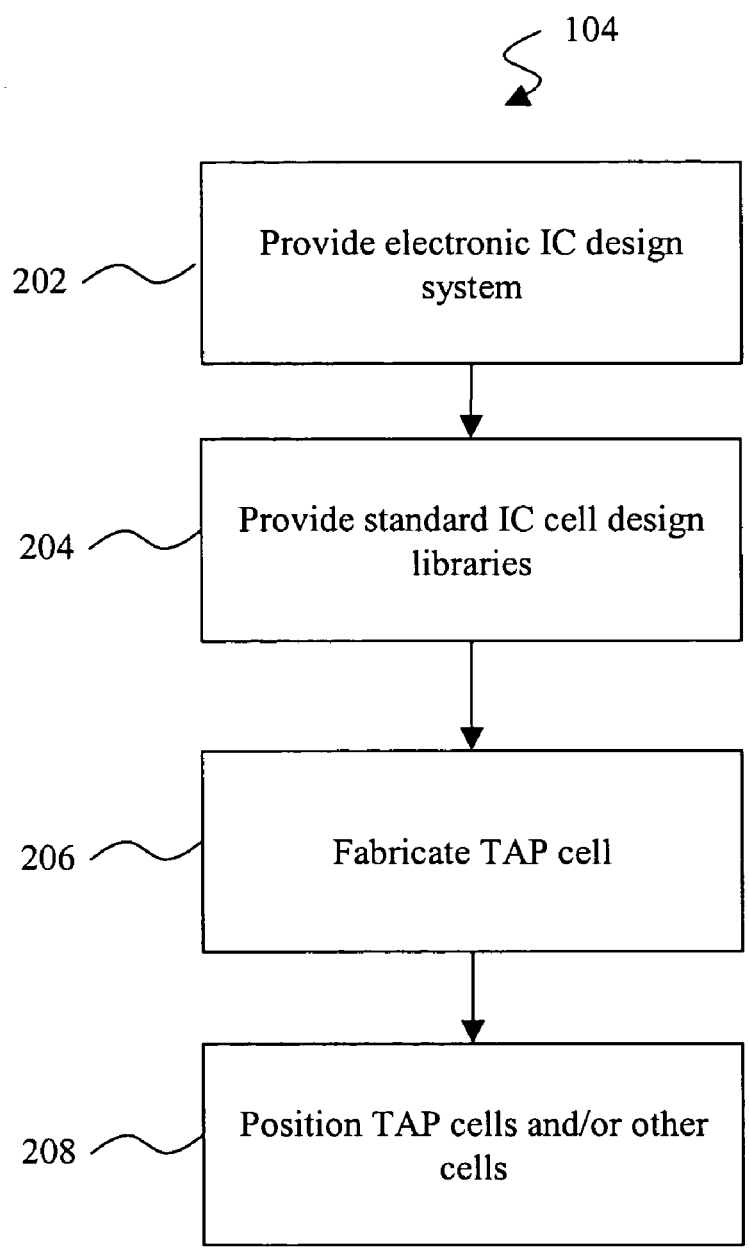
FIG. 2 is a flow-chart diagram of at least a portion of a method according to aspects of the present disclosure.

Referring to FIG. 2, illustrated is a flow-chart diagram of at least a portion of one embodiment of a method 200 of providing an energy efficient cell architecture of the component 104. The method 200 can begin at a step 202 in which an electronic integrated circuit (IC) design system is provided, initiated, accessed, etc. The electronic IC design system may include a plurality of computing devices and software systems that allow for the graphical manipulation of IC component representations. The IC component representations can include FETs, capacitors, amplifiers, logical operators, resistors, conducting interconnects, doped regions, and cells constructed of many components, among other possible representations. The electronic IC design system may include a plurality of tools for electrical device simulation and modeling. For example, a simulation program with IC emphasis (e.g., SPICE) and/or other analytical tools may be incorporated in the electronic IC design system. The electronic IC design system may be coupled to a plurality of libraries, such as at a step 204 or another step, if not already so coupled. The libraries may comprise IC sub-component layouts, which may be employed for various portions of the overall design.

Thus, in one embodiment, at step 204, sub-component layouts including a plurality of commonly used or standard IC cell design libraries may be provided. The standard IC cell design libraries may include a plurality of semiconductor IC device design cells, such as DRAM, EPROM, EEPROM, SDRAM, and/or other logical devices. The standard IC cell design libraries may further include cells of analog components, such as capacitors, inductors, resistors, and/or other components.

At a step 206, new IC cell libraries may be added to the standard IC design library. New IC cell libraries may additionally or alternatively be fabricated by modifying the existing standard IC cell design libraries. For example, in one embodiment, a tap cell may be created by the modification of the doped regions of a standard FET or other cell, among other possible modifications. As in embodiments described below or otherwise within the scope of the present disclosure, such tap cells may provide well biasing to reduce current leakage and/or tune threshold voltage of FET and other cells associated therewith.

For example, a tap cell may comprise one or more doped wells in which one or more thin oxide or diffusion regions having a greater dopant concentration is formed. Each such thin oxide or diffusion region may hereafter be referred to herein as in an "OD" or an "OD region." In one embodiment, a tap cell may comprise an N well and a P well, wherein the N well may include an N+ OD and the P well may comprise a P+ OD. The N well may additionally or alternatively comprise a P+ OD, and the P well may additionally or alternatively comprise an N+ OD. The implantation of any OD within the scope of the present disclosure may be carried out by ion beam implantation, plasma source ion implantation, and/or other conventional or future-developed processes.

Such tap cells may have interconnects for connecting one or more OD regions with the an external bias voltage source, such that the wells of associated PMOS and NMOS devices may be back biased. In some embodiments, such a tap cell may be employed to reduce power leakage in one or more semiconductor devices.

At a step 208, the tap cells and other cells may be laid out in an IC design, including in any vertical and/or horizontal position, and can be coupled to a myriad of IC cells. The tap cells may be arranged within an IC design layout prior to, after, or concurrently with the layout of other cells. The tap cells may be placed at random or specific interval spacing relative to each other and other types of cells, wherein power leakage reduction and control may be optimized by the quantity and positioning of the tap cells. The interval spacing of the tap cells may be based on the geometric dimensions of associated FETs and other devices, such that as geometries continue to shrink the frequency and spacing of tap cells may increase or decrease as desired. The tap cells may also have a bias voltage source and/or controller that is separate from the voltage source and/or controller of the associated devices. The voltage source and/or controller for the tap cells may be located local or remote relative to the associated devices, possibly on a separate die or chip. Each tap cell may have separate voltage sources, or all tap cells may be controlled by a single voltage source. Clusters of tap cells within an IC may each have a shared voltage, such that each cluster of tap cells in an IC may be connected to a corresponding voltage source and/or controller.

Figure 3A:
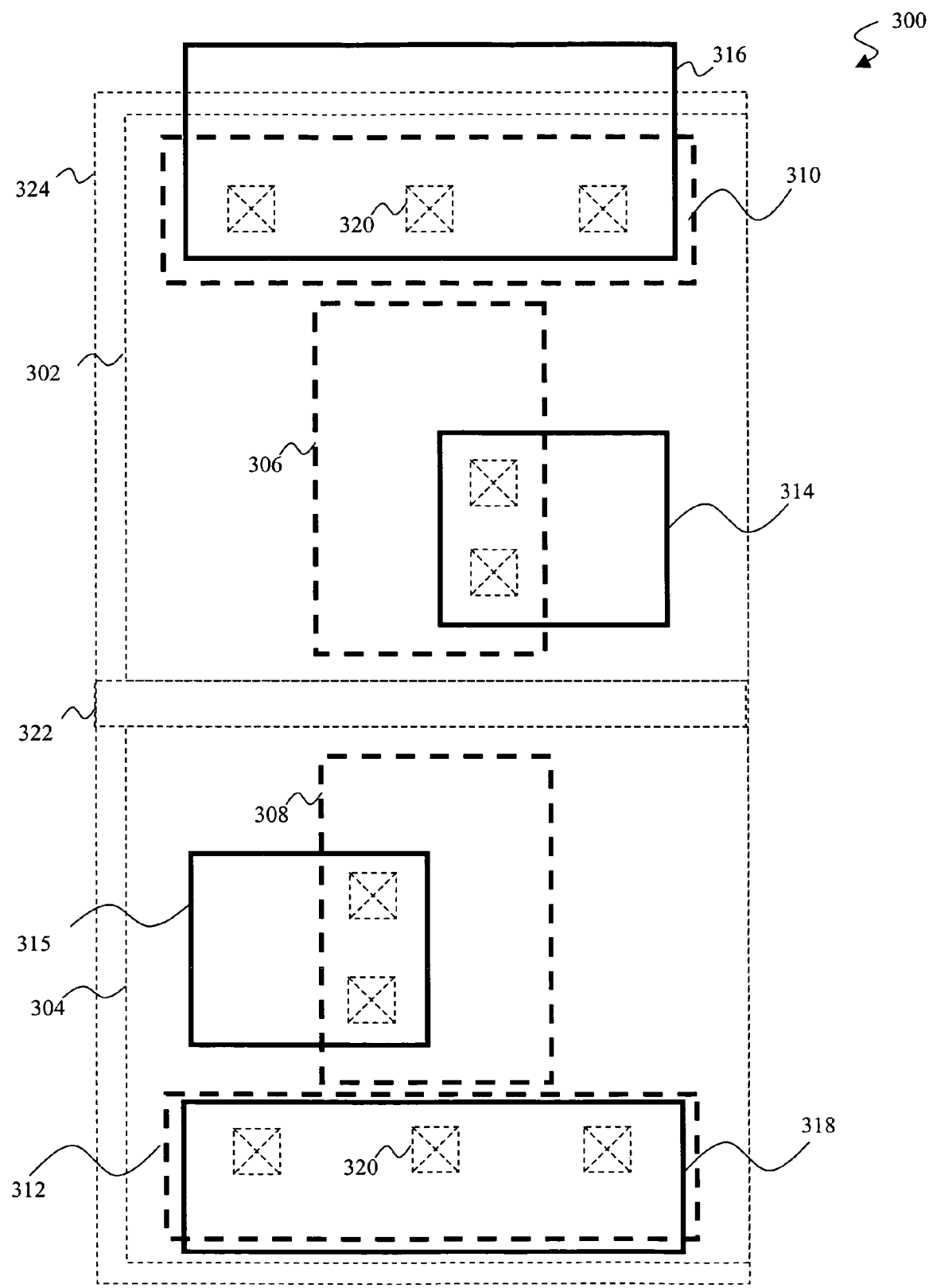
FIG. 3a is a layout view of at least a portion of one embodiment of a modified standard tap cell construction according to aspects of the present disclosure.

Referring to FIG. 3a, illustrated is a layout view of at least a portion of one embodiment of a tap cell 300 constructed according to aspects of the present disclosure. The tap cell 300 includes an N well ("NW") 302 and a P well ("PW") 304. The NW 302 and/or the PW 304 may be integral to or otherwise contact other wells employed to form neighboring FETs and/or other devices, including standard cells of such devices (hereafter collectively referred to as "associated cells"). The NW 302 and PW 304, including portions thereof that may be employed to form associated cells, may be enclosed by a deep NW ("DNW"), such as in embodiments in which the substrate in which the tap cell 300 is formed is a P doped substrate. The NW 302 may comprise an n+ doped OD ("N+ OD") 306 and a p+ doped OD ("P+ OD") 310. The P-well 304 may comprise a P+ OD 308 and an N+ OD 312. The NW 302 and the PW 304 may be formed adjacent one another, separated by a portion of the substrate in which they are formed, or separated by an isolation structure 322, such as local oxidation or shallow trench isolation, if desired.

Electrical connection to the NW 302 and the PW 304 may be accomplished through the N+ OD 306 and the P+ OD 308. For example, contact to the N+ OD 306 and the P+ OD 308 may be accomplished by contacts, vias, interconnects, and/or other conductive elements. Such conductive elements may comprise one or more conductive layers, possibly including a refractory barrier material lining and a bulk conductive material filler. For example, the illustrated tap cell 300 embodiment employs contacts 320 extending between elements of a first metal layer and the N+ OD 306, the P+ OD 308, the P+ OD 310, and the N+ OD 312. The first metal layer may be the first metal layer formed in an IC interconnect structure formed over the tap cell 300 and associated cells. In the illustrated embodiment, the first metal layer includes an N+ OD interconnect 314, a P+ OD interconnect 315, a ground interconnect 316, and a power interconnect 318, although additional or alternative interconnects may also be formed in the first metal layer, and additional or alternative metal layers or components may be employed to connect the NW 302 and the PW 304 to one or more bias voltage sources.

Figure 3B:
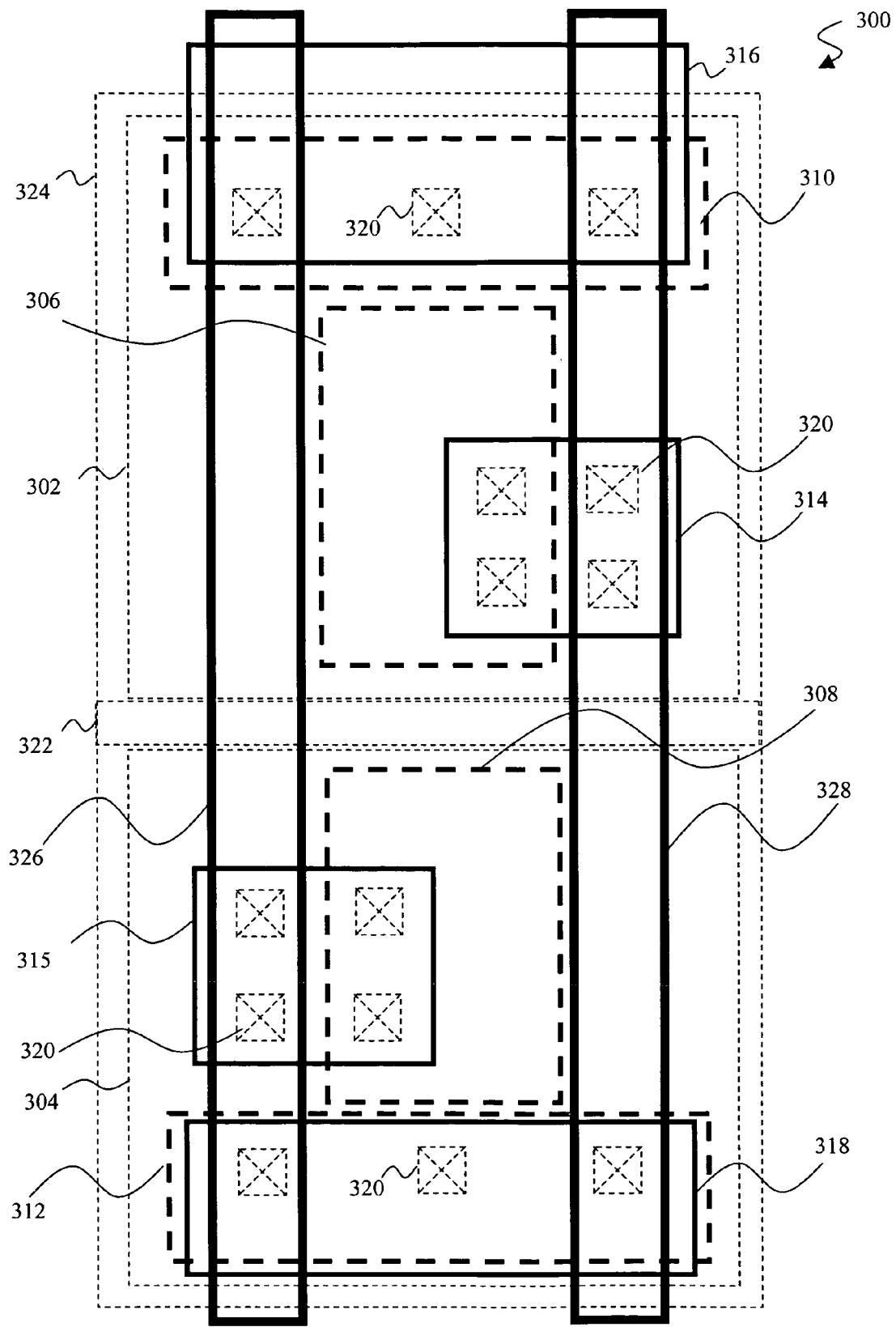
FIG. 3b is a layout view of at least a portion of one embodiment of a modified standard tap cell construction with interconnect attachment according to aspects of the present disclosure.

Referring to FIG. 3b, illustrated is a layout view of the tap cell 300 shown in FIG. 3a in a subsequent stage of manufacture in which the tap cell 300 includes and/or is interconnected by conductive overdrive taps $V_{BB}$ and $V_{pp}$ or other bias voltage interconnects 326, 328. The interconnects 326, 328 may be part of a second metal layer or one or more higher level metal layers in an interconnect structure. The N+ OD 306 and the P+ OD 308 of the tap cell 300 may be electrically connected to the interconnects 326, 328, respectively, by one or more contacts 320. The interconnects 326, 328 may thus connect the N+ OD 306 and the P+ OD 308 to one or more bias voltage power supplies on the substrate, chip or die and/or one or more external power supplies.

Figure 3C:
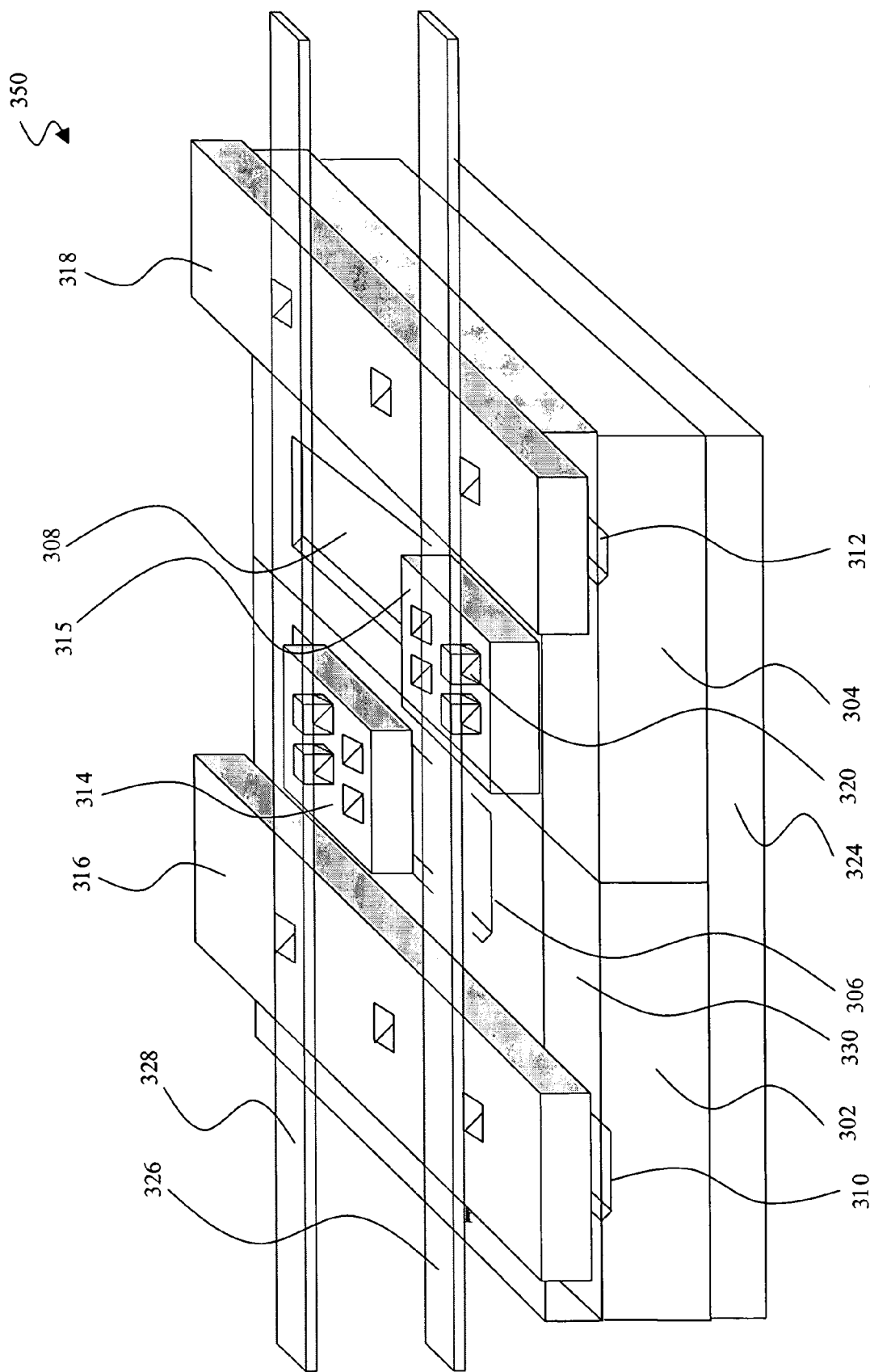
FIG. 3c is a perspective view of at least a portion of one embodiment of a modified standard tap cell construction with interconnect attachment according to aspects of the present disclosure.

Referring to FIG. 3c, illustrated is a perspective view of at least a portion of one embodiment of the tap cell 300 shown in FIG. 3b, herein designated by the reference numeral 350. The tap cell 350 is substantially similar to the tap cell 300, although the tap cell 350 does not include the isolation structure 322 shown in FIGS. 3a and 3b.

The perspective view of the tap cell 350 illustrates the multiple layers that may be fabricated to form a tap cell according to aspects of the present disclosure. For example, in the illustrated embodiment, the tap cell 350 includes a dielectric layer 330 that is deposited or otherwise located on or over the N+ OD 306, the P+ OD 308, the P+ OD 310, and the N+ OD 312. The dielectric layer 330 may isolate the N+ OD interconnect 314, the P+ OD interconnect 315, the ground interconnect 316, and the power interconnect 318. The interconnects 314–316, 318 may comprise one or more refractory metal barrier layers and one or more bulk metal layers. The barrier layers may comprise Ti, TiN, Ta, TaN, TaW, TiW, and/or other materials, and the bulk layers may comprise Cu, Al, and/or other materials. In one embodiment, one or more of the interconnects 314–316, 318 and/or the interconnects 326, 328 comprises highly conductive nano-materials such as carbon nano-tubes, fullerenes, and/or other nano-material, including dopant-implantable nano-material.

Figure 4A:
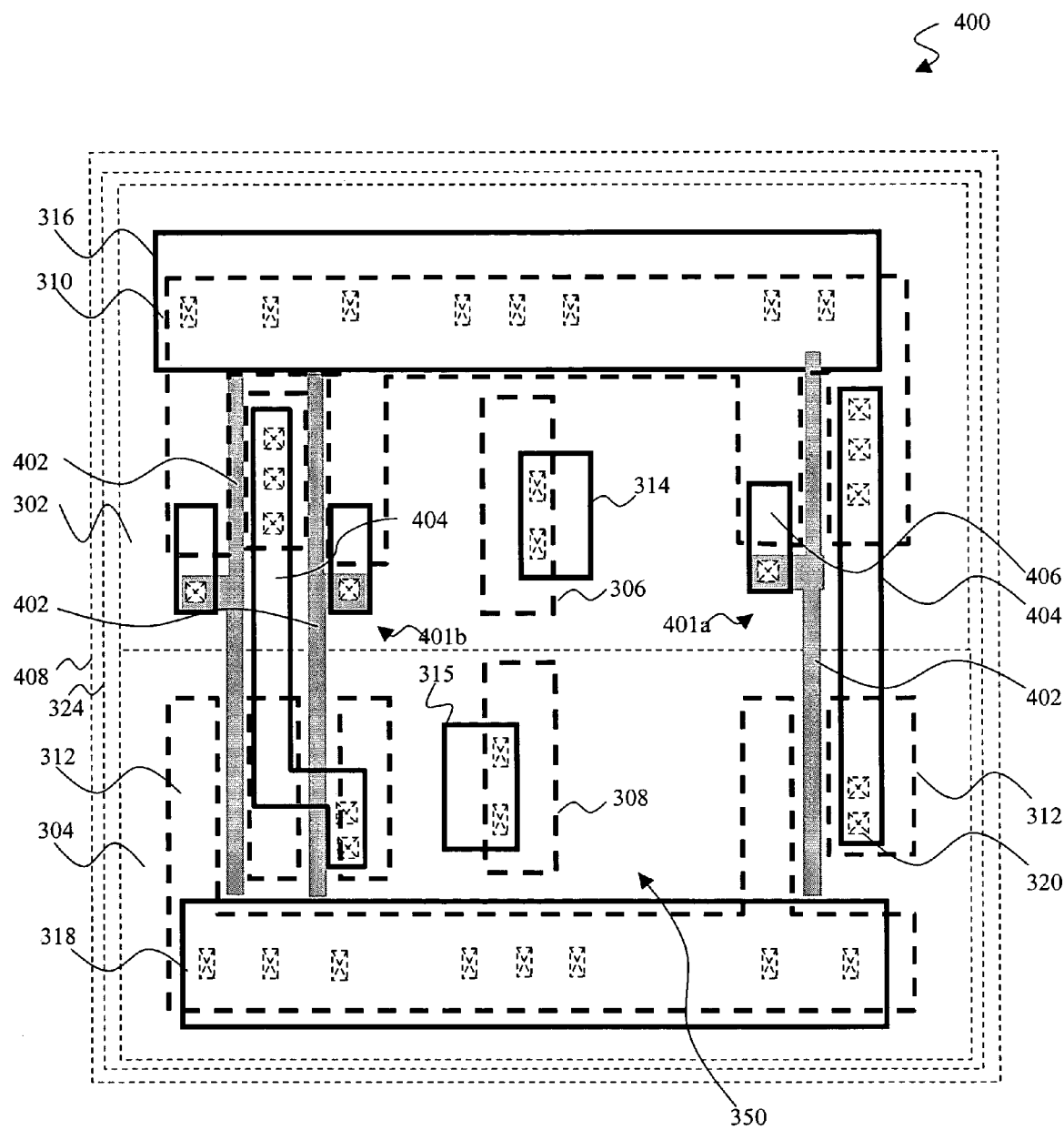
FIG. 4a is a layout view of at least a portion of one embodiment of an integrated circuit design with inverters and tap cell according to aspects of the present disclosure.

Referring to FIG. 4a, illustrated is a layout view of at least a portion of one embodiment of an apparatus 400 according to aspects of the present disclosure. The apparatus 400 is one environment in which the tap cell 300 shown in FIGS. 3a and 3b and/or the tap cell 350 shown in FIG. 3c may be implemented. In the illustrated embodiment, the apparatus 400 is or composes a portion of a block of associated cells ("cell block") which includes the tap cell 300 shown in FIGS. 3a and 3b, an inverter cell 401a, and a "NAND" cell 401b. Of course, the apparatus 400 may include associated cells other than and/or or in addition to those shown in FIG. 4a. The cell block 400 may be electrically isolated from other cell blocks by the incorporation of the DNW 324, which may in some embodiments be a deep P well ("DPW"). The cell block 400 may also or alternatively be isolated from surrounding cell blocks by an outer N doped or P doped ring structure 408.

The inverter and NAND cells 401a, 401b may each comprise a plurality of CMOS transistors formed in corresponding portions of the NW 302 and the PW 304. The tap cell 300 in the block cell 400 can provide inverter- and/or NAND-cell body potential through back bias to the NW 302 and the PW 304, which can provide a reduction of leakage power of the inverter and NAND cells 401a, 401b, and can provide control of IC timing performance. The PMOS and NMOS devices of the inverter and NAND cells 401a, 401b may be interconnected by gates 402 and conductive interconnects 404. The gates 402 may comprise one or more material layers, possibly including a layer of $HfO_2$ or other high-k material interposing layers of ultra-thin, salicided $SiO_2$ and polysilicon. In one embodiment, one or more of the gates 402 comprises conductive nano-materials, such as carbon nano-tubes, fullerenes, and/or other dopant implantable nano-materials.

The cell block 400 with the tap cell 300 (and/or 350) may have well-biasing voltages of predetermined values at any time upon the application of power to an IC. Alternatively, the well-biasing voltage may be dynamically set based on various operating conditions. For example, if the IC is in a sleep mode for power conservation, a signal may be sent to the tap cell 300 to activate deep back biases to the N+ OD 306 and the P+ OD 308, which can result in a significant reduction in standby current leakage of the associated cells. The well-biasing voltages applied to the N+ OD 306 and the P+ OD 308 can also be set to a myriad of values at different locations within an IC. Therefore, in the case of a central processing unit which can have many different types of logical cells, each IC component or cluster of components may have different back bias settings corresponding to different tap cells 300, and which can be simultaneously or sequentially switched to different values corresponding to different modes of operation, possibly optimizing the reduction of leakage power. Moreover, the location of the one or more tap cells 300 within each cell block 400 is variable. For example, the location may be altered to optimize layout/ spacing, such as to maximize cell density while minimizing the drop in back-bias potential that may occur over an extended distance.

Figure 4B:
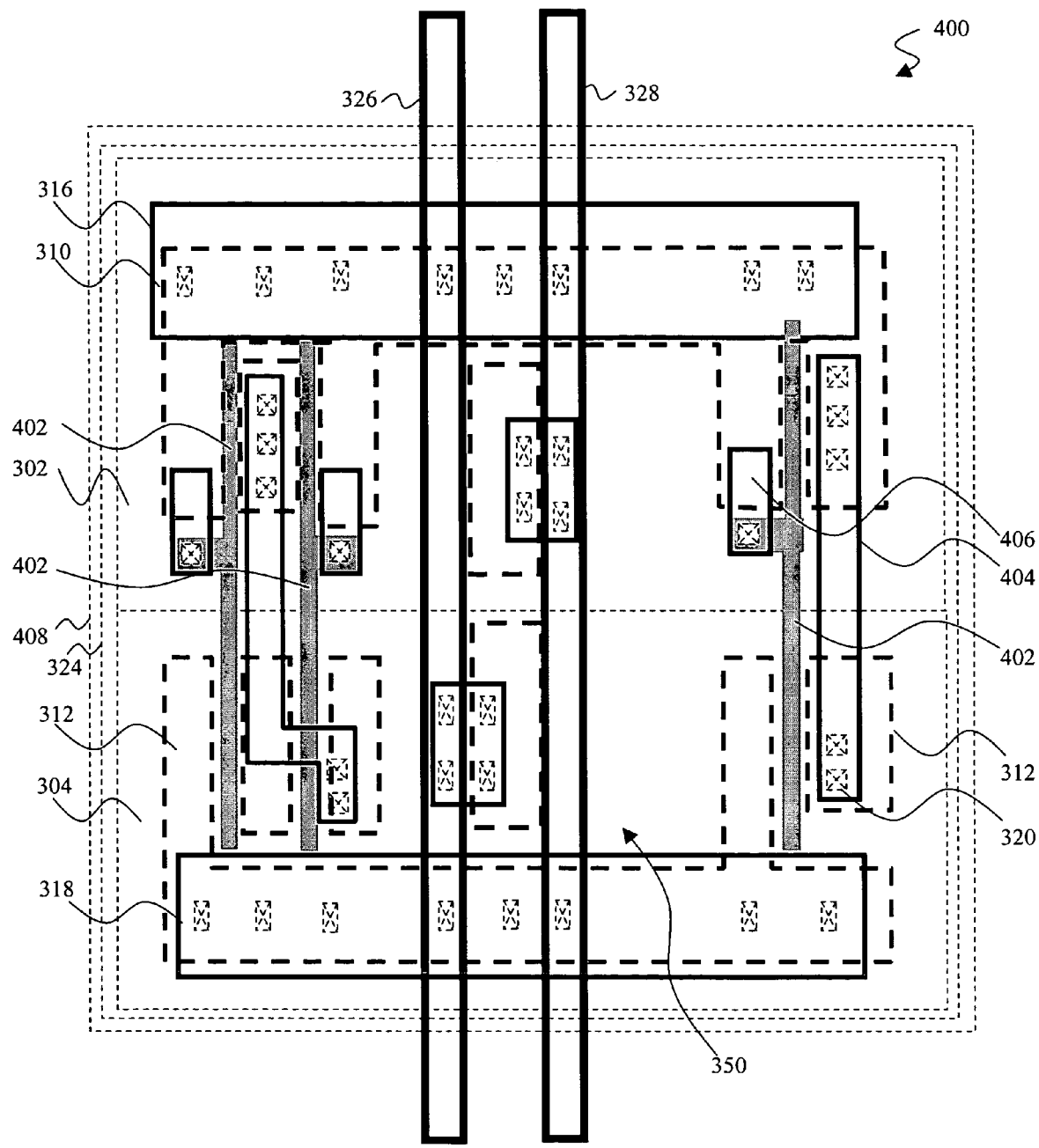
FIG. 4b is a layout view of at least a portion of one embodiment of an integrated circuit design with inverters, tap cell, and bias voltage interconnects according to aspects of the present disclosure.

Referring to FIG. 4b, illustrated is a layout view of the block cell 400 shown in FIG. 4a with the addition of conductive overdrive taps $V_{BB}$ and $V_{pp}$ or other interconnects 326, 328. The interconnects 326, 328 may be interconnected to a cluster of tap cells 300 or to an individual tap cell 300, wherein pre-selected values for the back bias can be set. The interconnects 326, 328 may be connected to one or more separate power supplies other than the power supply employed to power the inverter and NAND cells 401a, 401b and/or other associated cells.

Figure 4C:
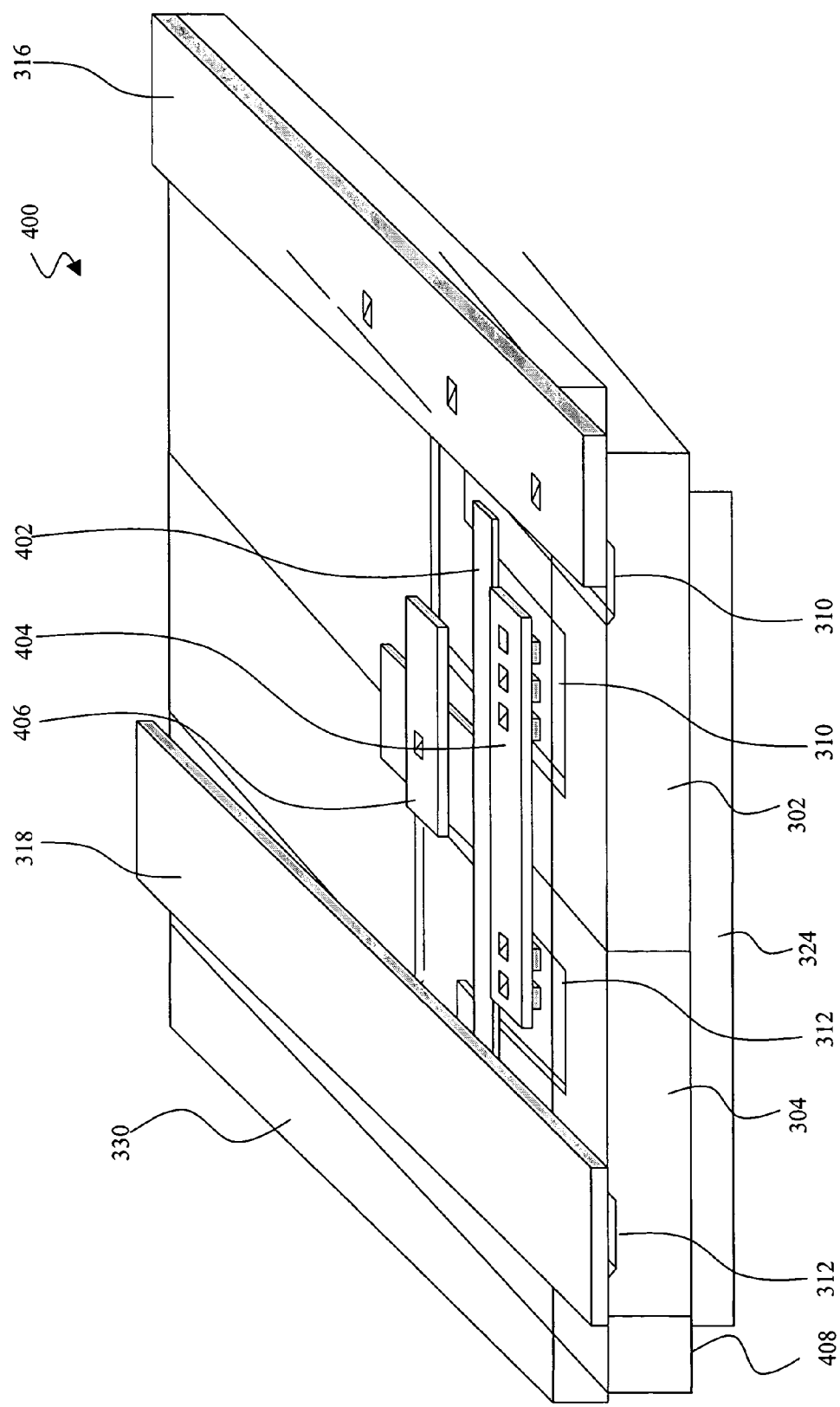
FIG. 4c is a perspective view of at least a portion of one embodiment of an integrated circuit design with inverters, tap cell, and bias voltage interconnects incorporating the constructed according to aspects of the present disclosure.

Referring to FIG. 4c, illustrated is a perspective view of at least a portion of cell block 400 shown in FIG. 4b. The ground interconnect (e.g., $V_{SS}$) 318 and power interconnect (e.g., $V_{DD}$) 316 connect to the N+ OD 312 and the P+ OD 310, respectively, such as through one or more vias 320 or other interconnecting members. A dielectric layer 330 may be formed below the ground interconnect 318 and power interconnect 316.

Those skilled in the art will recognize that aspects of the present disclosure are not limited to the tap cell 300 and/or 350 described above. For example, in addition to the embodiments illustrated herein, tap cells formed according to aspects of the present disclosure may be employed to interconnect myriad numbers and types of features incorporated in integrated circuits and other micro-electronic devices.

Figure 5:
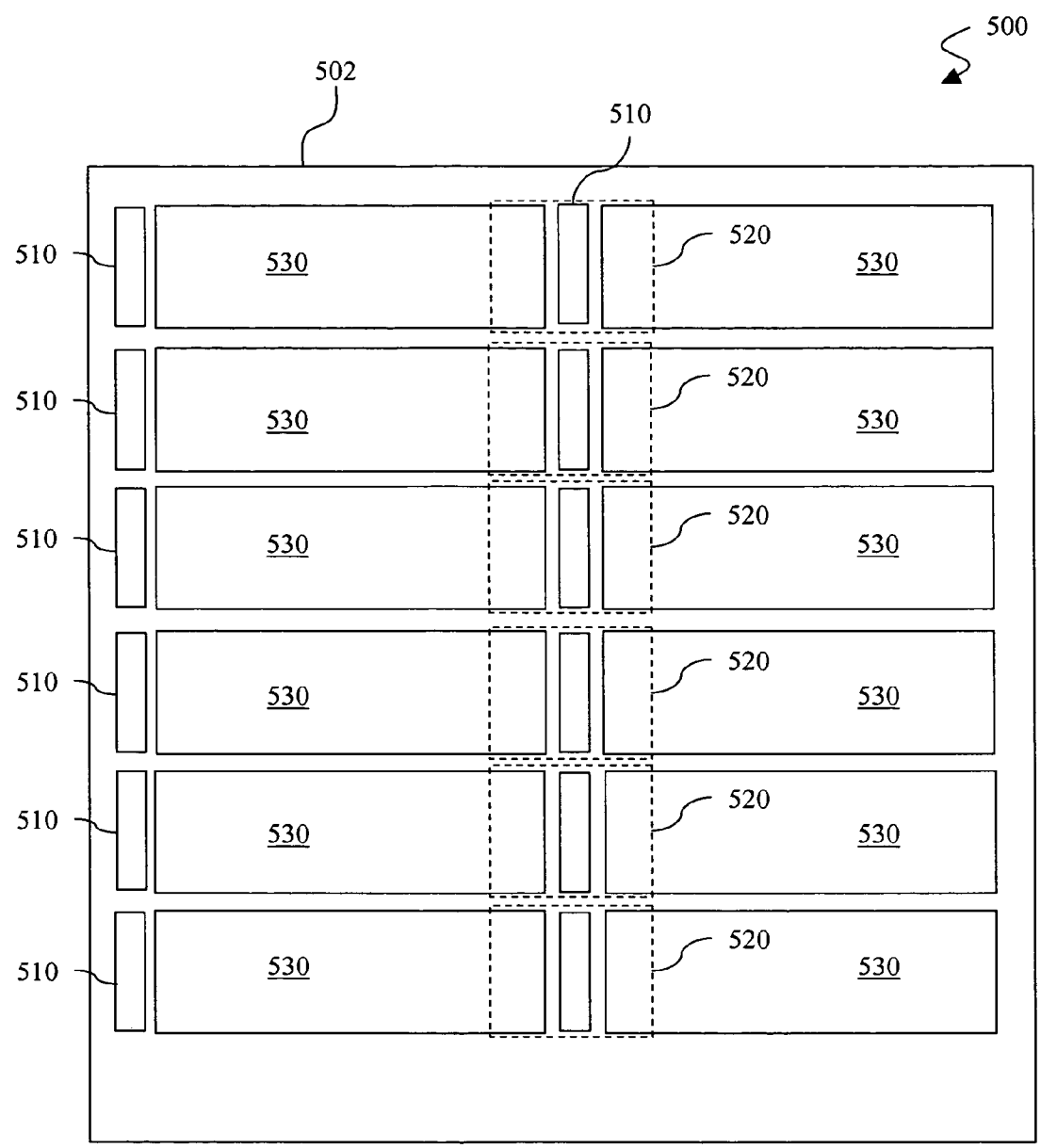
FIG. 5 is a layout view of at least a portion of one embodiment of an integrated circuit design with multiple tap cells and well back bias incorporating other logic devices according to aspects of the present disclosure.

Referring to FIG. 5, illustrated is a layout view of at least a portion of one embodiment of an integrated circuit 500 comprising a logic array 502 according to aspects of the present disclosure. The logic array 502 includes tap cells 510 formed integral to an array of associated cell blocks 530, wherein each cell block 530 may comprise a number of inverter cells, NAND cells, and/or other logic devices. Each of the tap cells 510 may be substantially similar to one or more of the tap cells 300, 350 described above. The logic array 502 may comprise a number of cell blocks 520, one or more of which may be substantially similar to the cell block 400 described above, although the cell blocks 520 may comprise a larger number of inverter cells, NAND cells, and/or other CMOS devices than the two cells depicted in FIGS. 4a–4c, such that large arrays of CMOS devices may be back biased by the plurality of tap cells 510.

Figure 6:
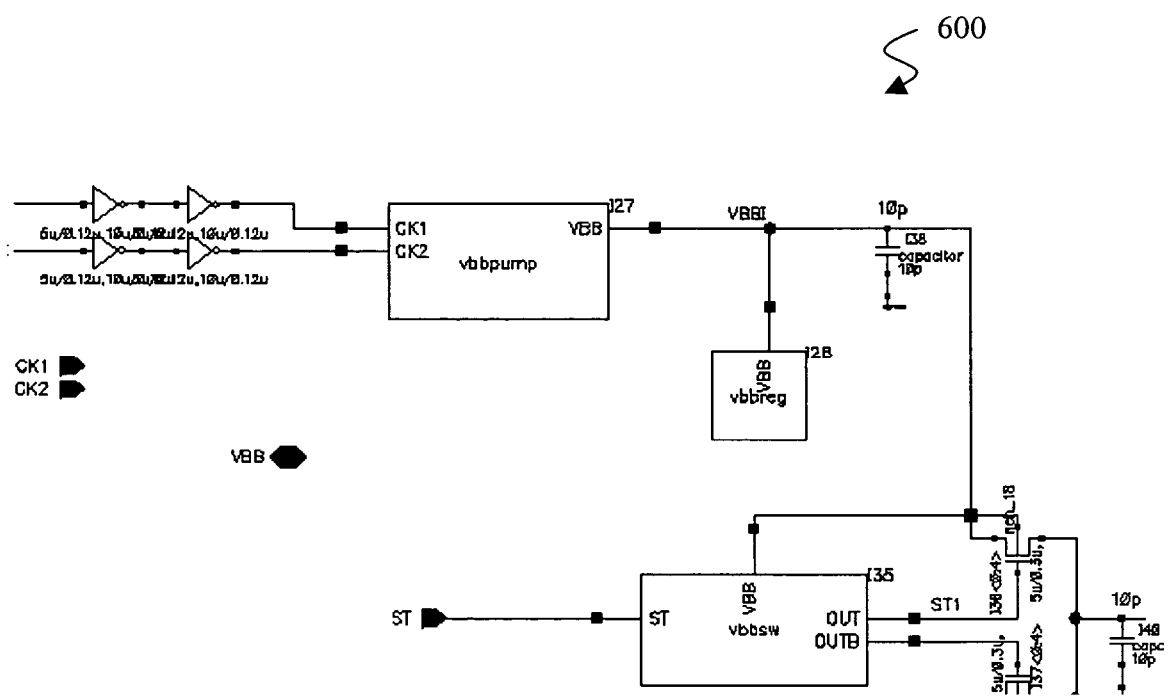
FIG. 6 is a circuit diagram of at least a portion of a driving circuit for providing $V_{BB}$ and $V_{pp}$ voltages to a counter-doped tap cell.

Referring now to FIG. 6, illustrated is a circuit diagram of at least a portion of one embodiment of a driving circuit 600 which may be employed to provide $V_{BB}$ and $V_{pp}$ voltages to a tap cell according to aspects of the present disclosure. The driving circuit 600 may be fabricated on the same chip or die and proximate a plurality of tap cells along with a logic array. The driving circuit 600 may alternatively be located off the chip or die, possibly being located on another chip. The driving circuit 600 may provide continuous, pulsed, and/or periodic $V_{BB}$ and $V_{pp}$ voltages to tap cells. The $V_{BB}$ and $V_{pp}$ voltages produced by the driving circuit 600 may be controlled through a feed-back loop wherein dynamic $V_{BB}$ and $V_{pp}$ voltages may be applied according to external conditions from sensory devices. For example, the feed-back system may include a thermocouple wherein the dynamic $V_{BB}$ and $V_{pp}$ voltages applied to one or more tap cells may be dependent upon the temperature sensed by the thermocouple.

Figure 7:
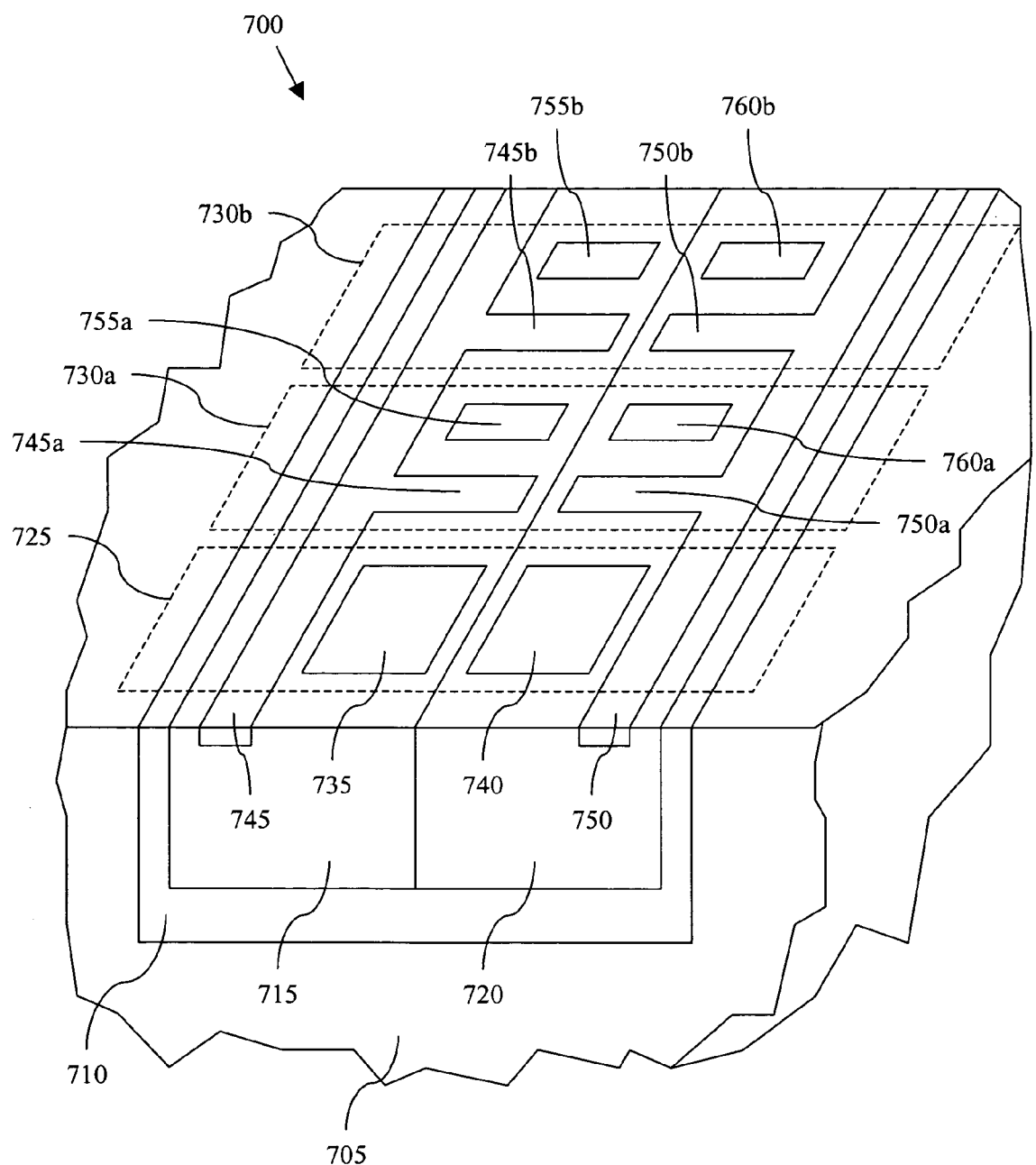
FIG. 7 is a perspective view of at least a portion of an embodiment of an apparatus in an intermediate stage of manufacture according to aspects of the present disclosure.

Referring to FIG. 7, illustrated is a perspective view of at least a portion of one embodiment of an apparatus 700 in an intermediate stage of manufacture according to aspects of the present disclosure. The apparatus 700 includes a substrate 705 which may substantially comprise P doped silicon. In other embodiments, the substrate 705 may not substantially comprise P doped silicon, but may comprise a number of deep P wells, or may comprise silicon other than P doped silicon. For the sake of simplicity, the following discussion assumes that the substrate 705 substantially comprises P doped silicon. However, those skilled in the art will recognize that the description that follows is applicable and/or readily adaptable to embodiments of the apparatus 700 in which the substrate 705 does not substantially comprise P doped silicon but are still within the scope of the present disclosure.

The apparatus 700 may comprise a deep N doped well ("DNW") 710 formed by conventional or future-developed processes. The DNW 710 may be employed to physically and/or electrically isolate an N doped well ("NW") 715 and a P doped well ("PW") 720 from nearby elements. A doped ring structure may additionally or alternatively be employed for such isolation.

The apparatus 700 may include one or more devices associated with one or more tap cells, such that the tap cells may back bias one or more of the associated devices. Accordingly, the substrate 705 may include a plurality of tap cell regions in each of which such a tap cell may be formed according to aspects of the present disclosure. Only one such tap cell region 725 is depicted in the illustrated embodiment, although the substrate 705 may include any number of tap cell regions 725 as may correspond to the number of tap cells included in the apparatus 700.

The substrate 705 may also include a number of associated device regions, such as associated device regions 730a, 730b. Of course, many embodiments will include many more associated device regions than the two regions 730a, 730b shown in the illustrated embodiment. Thus, any reference to the associated device regions 730a, 730b herein is applicable or readily adaptable to the other associated device regions not shown in FIG. 7. Also, although depicted as being at or proximate an end or perimeter of a block or cluster of associated device regions 730a, 730b, or otherwise proximate the perimeter of the block of associated device regions 730a, 730b, the tap cell region 725 may also be positioned at other locations within a particular cluster of associated device regions 730a, 730b, such as a position that is proximate a central region of the block of associated device regions 730a, 730b.

An N+ doped region ("N+ OD") 735 may be formed in the NW 715 and within the tap cell region 725. The N+ OD 735 may comprise a thin oxide or diffusion formed by ion implantation and/or other conventional and/or future-developed processes. In one embodiment, the N+ OD 735 may be formed by processes similar to those employed to form N+ type source/drain regions of CMOS transistors and, as such, may be substantially similar in composition and/or geometry to an N+ type source/drain region. In fact, in one embodiment, the N+ OD 735 may be formed simultaneously with the formation of such N+ type source/drain regions.

A P+ doped region ("P+ OD") 740 may be formed in the PW 720 and within the tap cell region 725. The P+ OD 740 may also comprise a thin oxide or diffusion formed by ion implantation and/or other conventional and/or future-developed processes. The P+ OD 740 may be formed by processes similar to those employed to form P+ type source/drain regions of CMOS transistors and, as such, may be substantially similar in composition and/or geometry to a P+ type source/drain region. In fact, in one embodiment, the P+ OD 740 may be formed simultaneously with the formation of such P+ type source/drain regions.

The apparatus 700 may also include an additional P+ OD 745 formed in the NW 715 and extending at least partially into the tap cell region 725 although, as in the illustrated embodiment, the P+ OD 745 may also extend completely through the tap cell region 725. As also shown in the illustrated embodiment, the P+ OD 745 may extend from the tap cell region 725 and into one or more or each of the associated device regions 730a, 730b. In one embodiment, however, the P+ OD region 745 may not extend into the tap cell region 725, or may be substantially confined to extending between adjacent ones of the associated device regions 730a, 730b. The P+ OD 745 may also include source/drain extensions 745a, 745b each extending towards a central portion of a corresponding one of the associated devices regions 730a, 730b, possibly in a direction that is substantially perpendicular to the remaining or main portion of the P+ OD 745, although also remaining substantially confined within the NW 715.

The apparatus 700 may also include an additional N+ OD 750 formed in the PW 720 and extending at least partially into the tap cell region 725 although, as in the illustrated embodiment, the N+ OD 750 may also extend completely through the tap cell region 725. The N+ OD 750 may extend from the tap cell region 725 and into one or more or each of the associated device regions 730a, 730b. In one embodiment, however, the N+ OD region 750 may not extend into the tap cell region 725, or may be substantially confined to extending between adjacent ones of the associated device regions 730a, 730b. The N+ OD 750 may also include source/drain extensions 750a, 750b each extending towards a central portion of a corresponding one of the associated devices regions 730a, 730b, possibly in a direction that is substantially perpendicular to the remaining or main portion of the N+ OD 750, although substantially confined within the PW 720.

In some embodiments, the N+ OD 735 and the P+ OD 740, possibly in conjunction with proximate regions of the NW 715 and the PW 720, substantially compose a tap cell, which may generally conform to and/or be indicated by the tap cell region 725. Thus, the following discussion relative to the tap cell region 725 is applicable or readily adaptable to a tap cell comprising the N+ OD 735, the P+ OD 740, and regions of the NW 715 and the PW 720 that are substantially within the imaginary border of the tap cell region 725 indicated by dashed lines in FIG. 7. In other embodiments, such a tap cell may comprise additional components, elements, or features, such as a portion of the DNW 710 within the tap cell region 725, portions of the P+ OD 745 and the N+ OD 750 within the tap cell region 725, and/or other items that may be formed over the tap cell regions, such as gate electrodes, interconnects, and other conductive members, as well as portions of insulating or dielectric layers within the tap cell region 725.

Additional P+ OD regions 755a, 755b may be formed in the NW 715, each within a corresponding one the associated device regions 730a, 730b. The P+ OD regions 755a, 755b may be source/drain regions and, thus, may be laterally offset from the main portion of the P+ OD 745 and the extensions 745a, 745b thereof. Similarly, additional N+ OD regions 760a, 760b may be formed in the PW 715, each within a corresponding one the associated device regions 730a, 730b. The N+ OD regions 760a, 760b may also be source/drain regions and, thus, may be laterally offset from the main portion of the N+ OD 750 and the extensions 750a, 750b thereof.

Figure 8:
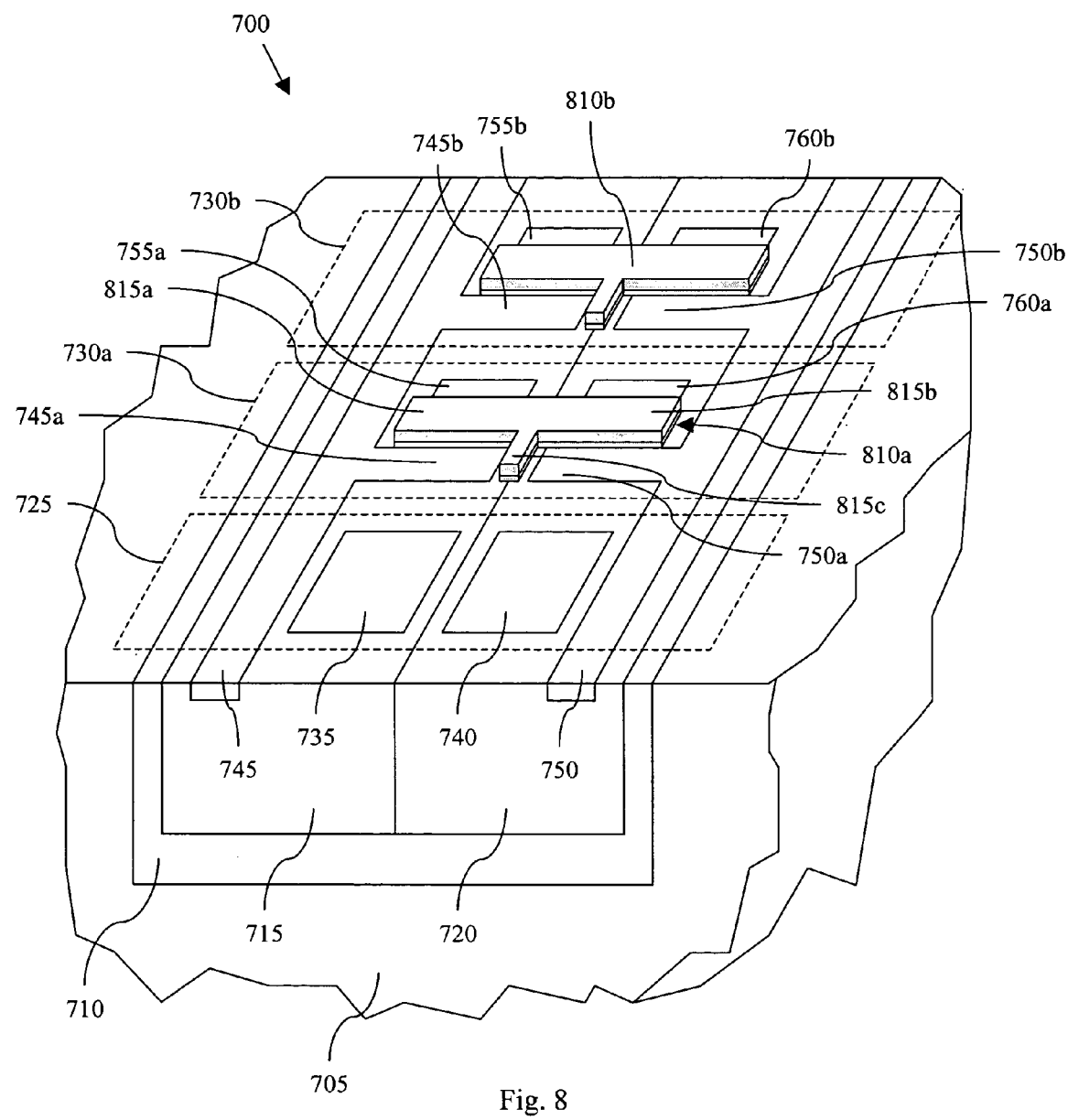
FIG. 8 is a perspective view of the apparatus shown in FIG. 7 in a subsequent stage of manufacture according to aspects of the present disclosure.

Referring to FIG. 8, illustrated is a perspective view of the apparatus 700 shown in FIG. 7 in a subsequent stage of manufacture in which a gate fabrication process has been performed to form gate electrodes 810a, 810b in each of the associated device regions 730a, 730b, respectively. The gate electrodes 810a, 810b may be formed by conventional or future-developed processes, such that each of the gate electrodes 810a, 810b may comprise one or more layers of dielectric material (e.g., gate oxide layers) collectively interposing one or more layers of polysilicon or other conductive materials. Moreover, although depicted herein as being formed after the OD regions 745, 750, 755a, 755b, 760a, 760b are formed, those skilled in the art will recognize that the gate electrodes 810a, 810b may be partially or completely formed prior to forming the OD regions, such that in some embodiments self-alignment principles may be employed.

Each of the illustrated gate electrodes 810a, 810b may substantially span the lateral separation between neighboring pairs of the OD regions 745, 750, 755a, 755b, 760a, 760b. For example, the gate electrode 810a includes a portion 815a substantially spanning the lateral offset between the P+ OD extension 745a and the P+ OD 755a in a direction that is substantially parallel to the longitudinal axis of the P+ OD 745, and also includes a portion 815b substantially spanning the lateral offset between the N+ OD extension 750a and the N+ OD 760a in a direction that is substantially parallel to the longitudinal axis of the N+ OD 750. Each of the portions 815a, 815b may extend laterally away from a central portion of the associated device region 730a to or beyond an outer edge of the P+ OD 755a and the N+ OD 760a, respectively. The gate electrode 810a may also include an extension 815c extending away from a central portion of the associated device region 730a to or beyond an edge of the P+ OD extension 745a that is opposite the gate electrode portion 810a, possibly in a direction that is substantially parallel to the longitudinal axis of the P+ OD 745 and/or the N+ OD 750. The gate electrode 810b may be substantially similar in shape and/or other configuration aspects to the above-described aspects of the gate electrode 810a.

The gate electrodes 810a, 810b described above may have shapes, patterns, profiles, and/or other aspects that differ from those shown in FIG. 8. For example, the illustrated gate electrodes 810a, 810b may be employed when the device being formed in each of the associated device regions 730a, 730b is an inverter device. However, other shapes or patterns of the gate electrodes 810a, 810b, as well as the number of gate electrodes in each associated device region 730a, 730b, may be altered if other types of devices are being formed in the associated device regions 730a, 730b.

Figure 9:
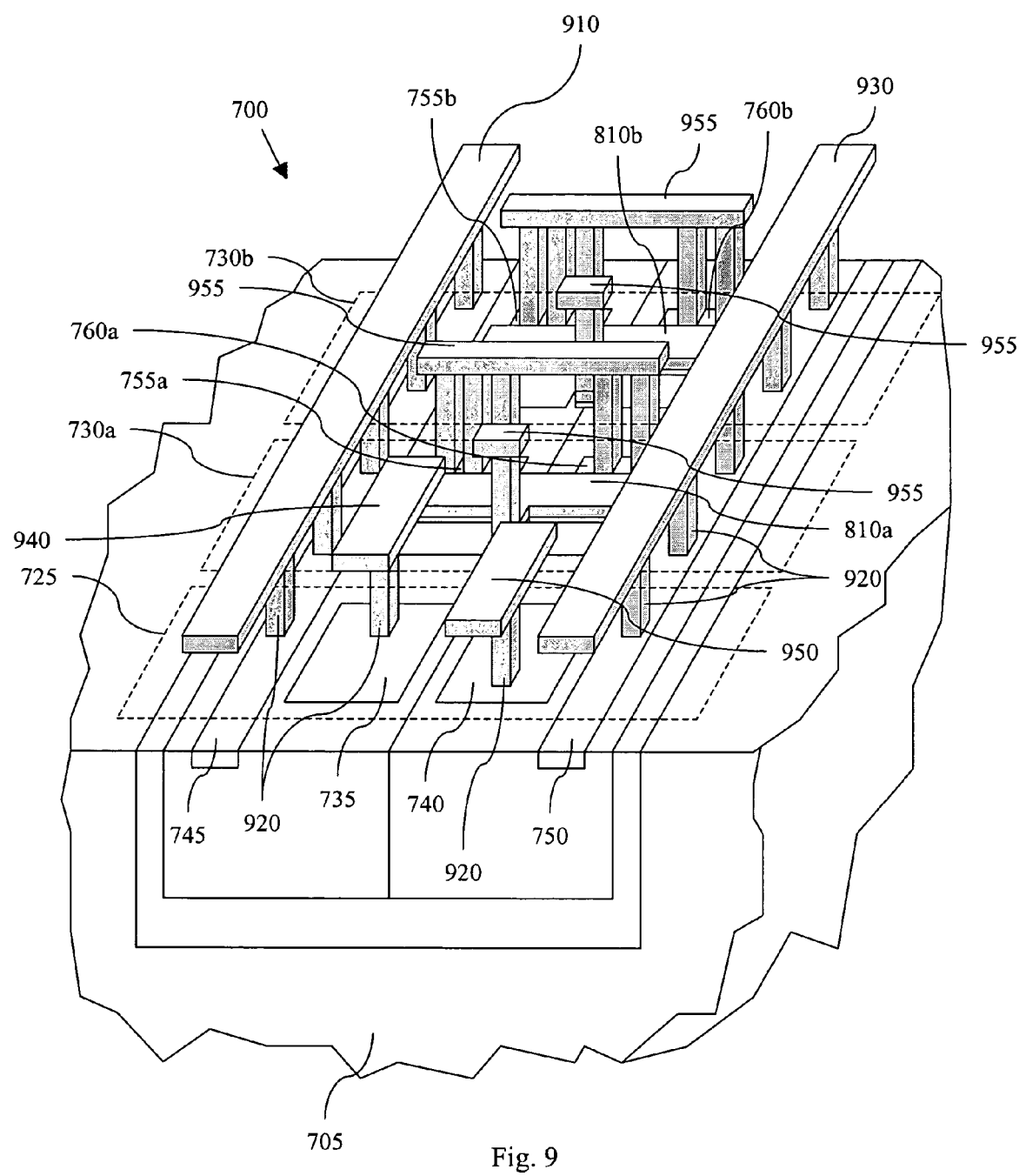
FIG. 9 is a perspective view of the apparatus shown in FIG. 8 in a subsequent stage of manufacture according to aspects of the present disclosure.

Referring to FIG. 9, illustrated is a perspective view of the apparatus 700 shown in FIG. 8 in a subsequent stage of manufacture in which a elements of a first metal layer and corresponding contacts have been formed. The first metal layer may be substantially similar in composition and manufacture to a metal layer employed in an interconnect structure of an integrated circuit device, and in some embodiments is actually defined from the first metal layer in such an interconnect structure. However, in other embodiments, one or more or each of the elements described below as being defined in a first metal layer of an interconnect structure may also or alternatively be defined in or from another metal layer of an interconnect structure, such as a third metal layer therein. For the sake of clarity, however, the following discussion assumes that the first metal layer of the associated device interconnect structure is employed as the first conductive layer employed in the interconnection of the one or more tap cells formed in the apparatus 700, although such assumption is not limiting to the scope of the present disclosure.

In one embodiment, the first metal layer may be formed by forming one or more substantially planar pre-level and/or interlevel dielectric layers over the gate electrodes 810a, 810b and the substrate 705, including over the OD regions 745, 750, 755a, 755b, 760a, 760b, and subsequently forming conductive members in and/or on the one or more dielectric layers. The dielectric layers may comprise silicon dioxide, SILK (a product of Dow Chemical of Michigan), BLACK DIAMOND (a product of Applied Materials of Santa Clara, Calif.), and/or other insulating materials, and the conductive members may comprise one or more layers of conductive and/or refractive materials. For the sake of clarity, the one or more dielectric layers interposing the first metal layer conductive members and the substrate 705 or other underlying features is not shown in FIG. 9.

One of the conductive members formed in the first metal layer in the apparatus 700 may be an interconnect 910 that may be connected to the P+ OD 745 at various locations by vias, contacts, or other interconnects (hereafter collectively referred to as interconnects), several of which are designated by the reference numeral 920 in FIG. 9. The interconnect 910 may extend over one or more or each of the tap cell region 725 and the associated device regions 730a, 730b, possibly in a direction that is substantially parallel to the P+ OD 745. The interconnect 910 may be ultimately connected to a power supply that is employed, at least in part, in driving the associated devices formed in the associated device regions 730a, 730b, such as by providing a power supply voltage or potential. Thus, the interconnect 910 may be a $V_{DD}$ interconnect. Moreover, the P+ OD 745 may be a source OD for associated PMOS devices formed in the associated device regions 730a, 730b.

Another of the conductive members formed in the first metal layer in the apparatus 700 may be an interconnect 930 that may be connected to the N+ OD 750 at various locations by interconnects 920. The interconnect 930 may extend over one or more or each of the tap cell region 725 and the associated device regions 730a, 730b, possibly in a direction that is substantially parallel to the P+ OD 745, the N+ OD 750, and/or the interconnect 910. The interconnect 930 may be ultimately connected to a ground conductor or other ground potential source that is employed, at least in part, in driving the associated devices formed in the associated device regions 730a, 730b. Thus, the interconnect 920 may be a $V_{SS}$ interconnect. Moreover, the N+ OD 750 may be a source OD for associated NMOS devices formed in the associated device regions 730a, 730b.

The first metal layer in which the interconnects 910, 930 are defined may also include an interconnect 940 that may be connected to the N+ OD 735 by an interconnect 920, as well as an interconnect 950 that may be connected to the P+ OD 740 by an interconnect 920. The interconnects 940, 950 may extend in substantially opposite directions, possibly in directions that are substantially parallel to the P+ OD 745, the N+ OD 750, and/or the interconnects 910, 930.

The apparatus 700 may also include various interconnects 955 connected to the gate electrodes 810a, 810b or OD regions 745a, 745b, 750a, 750b, 755a, 755b, 760a, 760b. These interconnects 955 may be employed for interconnecting devices formed in the associated device regions 730a, 730b, such as may be necessary to perform desired logic and/or other CMOS device functions. However, because use of the tap cell formed in the tap cell region 725 is applicable or readily adaptable with a variety of CMOS device configurations, the further interconnection of the associated devices in the associated device regions 730a, 730b through the interconnects 955, whether directly or indirectly, will not be further discussed herein. Nonetheless, examples of such interconnection of devices formed in the associated device regions 730a, 730b are provided in the discussion above.

Figure 10:
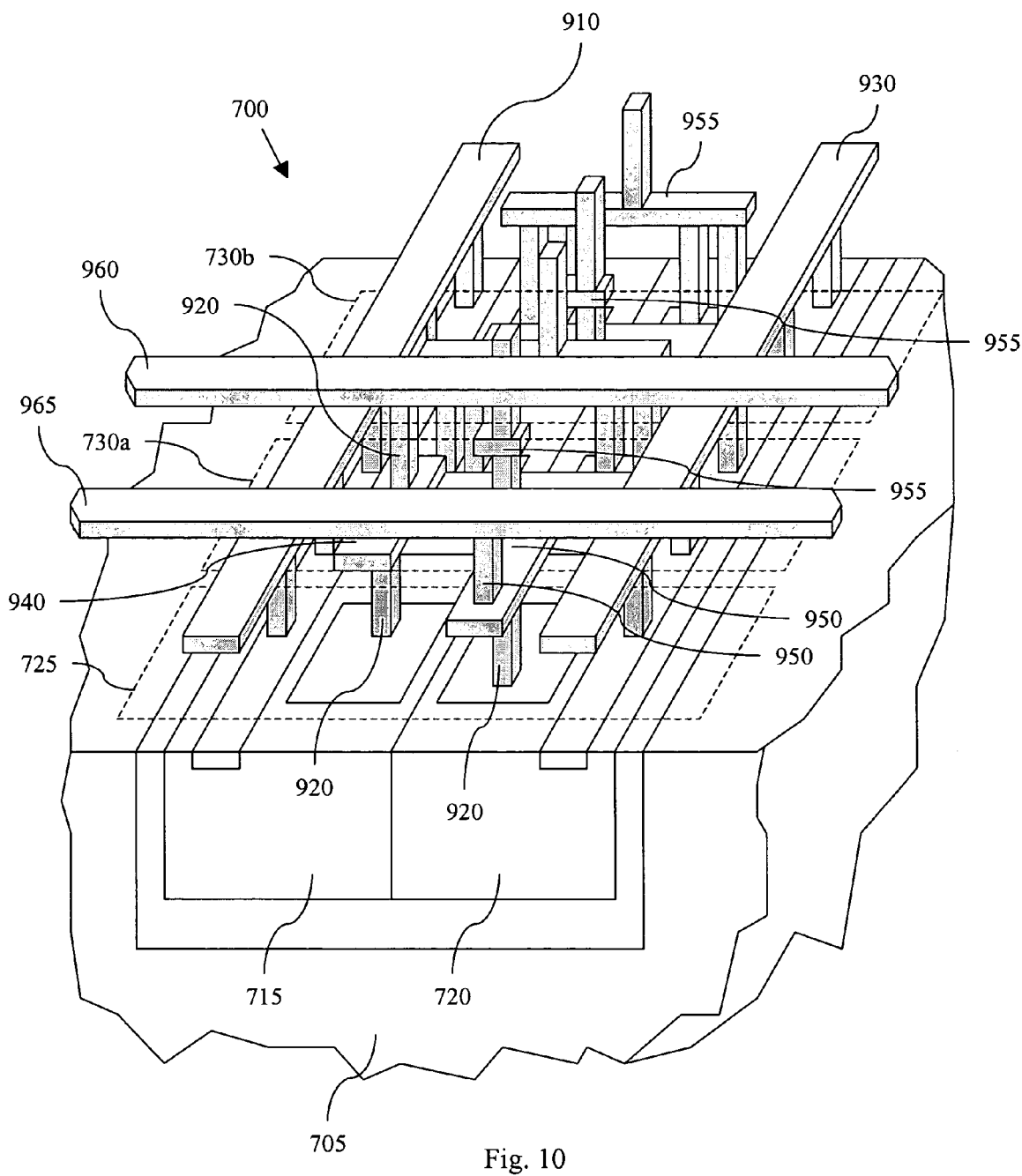
FIG. 10 is a perspective view of the apparatus shown in FIG. 9 in a subsequent stage of manufacture according to aspects of the present disclosure.

Referring to FIG. 10, illustrated is a perspective view of the apparatus 700 shown in FIG. 9 in a subsequent stage of manufacture in which a elements of a second metal layer and corresponding contacts have been formed. The second metal layer may be substantially similar in composition and manufacture to a metal layer employed in an interconnect structure of an integrated circuit device, and in some embodiments is actually defined from the second metal layer in such an interconnect structure. However, in other embodiments, one or more or each of the elements described below as being defined in a second metal layer of an interconnect structure may also or alternatively be defined in another metal layer of an interconnect structure, such as a fourth metal layer therein. For the sake of clarity, however, the following discussion assumes the second metal layer of the associated device interconnect structure is employed as the second conductive layer employed in the interconnection of the one or more tap cells being formed in the apparatus 700.

The second metal layer may be formed by forming one or more substantially planar interlevel dielectric layers over the interconnects 910, 930, 940, 950, 955 and one or more previously formed pre-level and/or interlevel dielectric layers, and subsequently forming conductive members in and/or on the one or more dielectric layers. The dielectric layers may be substantially similar in composition and manufacture to the previously formed pre-level and/or interlevel dielectric layers, and the conductive members may comprise one or more layers of conductive and/or refractive materials. For the sake of clarity, the one or more dielectric layers interposing the second metal layer conductive members and the interconnects 910, 930, 940, 950, 955 or other underlying features is not shown in FIG. 10.

One of the conductive members formed in the second metal layer in the apparatus 700 may be an interconnect 960 that may be connected to the interconnect 940 by an interconnect 920. The interconnect 960 may extend over the tap cell region 725, possibly in a direction that is substantially perpendicular to the longitudinal axis of the P+ OD 745, the N+ OD 750, and/or the interconnects 910, 930. The interconnect 960 may be ultimately connected to a power supply that is employed, at least in part, in adjusting the back bias of the NW 715, including the portions of the NW 715 in which at least portions of associated PMOS devices formed in the associated device regions 730a, 730b may be formed. The power supply employed to back-bias the NW 715 may be separate from the power supply employed in driving devices formed in the associated device regions 730a, 730b, and may not be located on the same die or chip as the apparatus 700. For example, the NW 715 back-bias power supply may be ultimately connected to the apparatus 700 by wire bonding, flip-chip bonding, and/or other interconnection means.

The interconnect 960 may be a $V_{BB}$ interconnect. In such embodiments, the $V_{BB}$ potential at which the NW 715 may be biased via the interconnect 960 may be different than the potential of the power supply employed in driving devices formed in the associated device regions 730a, 730b ($V_{DD}$ in the present discussion) or the ground potential employed for such devices ($V_{SS}$ in the present discussion). For example, $V_{BB}$ may be greater than or less than $V_{DD}$ in magnitude and/or amplitude, may be in-phase or out-of-phase relative to $V_{DD}$, and may be applied to the NW 715 concurrently with or at different times relative to the application of $V_{DD}$ to devices formed in the associated devices regions 730a, 730b. Moreover, whereas $V_{DD}$ is likely a predetermined potential or signal, $V_{BB}$ may be dynamically adjustable or tunable, such that the back bias of the NW 715 may also be tunable.

Another conductive member formed in the second metal layer in the apparatus 700 may be an interconnect 965 that may be connected to the interconnect 950 by an interconnect 920. The interconnect 965 may extend over the tap cell region 725, possibly in a direction that is substantially perpendicular to the longitudinal axis of the P+ OD 745, the N+ OD 750, and/or the interconnects 910, 930, and/or substantially parallel to the interconnect 960. The interconnect 965 may be ultimately connected to a power supply that is employed, at least in part, in adjusting the back-bias of the PW 720, including the portions of the PW 720 in which at least portions of associated NMOS devices formed in the associated device regions 730a, 730b may be formed.

The power supply employed to back-bias the PW 720 may be separate from the power supply employed in driving devices formed in the associated device regions 730a, 730b, and may not be located on the same die or chip as the apparatus 700. For example, the PW 720 back-bias power supply may be ultimately connected to the apparatus 700 by wire bonding, flip-chip bonding, and/or other interconnection means. The PW 720 back-bias power supply may also be part of, the same as, or otherwise associated with the NW 715 back-bias power supply.

As used herein, the interconnect 965 may be a $V_{pp}$ interconnect. That is, the $V_{pp}$ potential at which the PW 720 may be biased may be different than $V_{DD}$ or $V_{SS}$. For example, $V_{pp}$ may be greater than or less than $V_{DD}$ in magnitude and/or amplitude, may be in-phase or out-of-phase relative to $V_{DD}$, and may be applied to the PW 720 concurrently with or at different times relative to the application of $V_{DD}$ to devices formed in the associated devices regions 730a, 730b. Moreover, whereas $V_{DD}$ is likely a predetermined potential or signal, $V_{pp}$ may be dynamically adjustable or tunable, such that the back bias of the PW 720 may also be tunable.

The control of $V_{BB}$ and $V_{pp}$ may be accessed off-chip or through programmable on-chip apparatus, such as one or more charge pumps and one or more bias voltage regulators. The control of $V_{BB}$ and $V_{pp}$ may also be constructed in preset values at power-up from either off-chip or on-chip. In one embodiment, the control of $V_{BB}$ and $V_{pp}$ may be configured as high bias voltages during sleep/idle mode(s) for low leakage power, and be connected to $V_{SS}$ and $V_{DD}$ for active mode.

Aspects of the tap cells described herein may also make forward-bias possible for performance with more expected leakages. For example, for forward biasing, $V_{BB}$ can be higher than $V_{SS}$, and $V_{pp}$ can be lower than $V_{DD}$. Aspects of the present disclosure may also permit a back-bias scheme to be mixed with many threshold voltage ($V_t$) technology improvements, which may allow for varying $V_t$ within the apparatus 700, such as to provide an extra high $V_t$ implant and a low $V_t$ implant in addition to a nominal $V_t$ implant for increasingly accurate, grained control of timing performance and leakage power control.

Examples of applications in which aspects of the present application may be employed include setting $V_{BB}$ and $V_{pp}$ to pre-determined values statically at any time or during powering up. $V_{BB}$ and $V_{pp}$ may also be dynamically set to pre-determined or other values, such as when a chip containing one or more tap cells and associated devices: (1) is determined to go into back-bias state or such status change is triggered by external events; (2) sends a trigger signal to activate the back-bias voltage controller, or another chip sends such a trigger signal, possibly depending on internal or external events; and/or (3) a back-bias voltage controller sends $V_{BB}$ and $V_{pp}$ to the chip to fulfill the back-bias control. Thus, in addition to the one or more back-bias power supplies connected ultimately to the NW 715 and the PW 720 to bias the NW 715 and PW 720 with different potential levels relative to the power supply and ground potential, including where the potential employed to bias the NW 715 is different than the potential employed to bias the PW 720, the back-bias controller apparatus which may be employed to achieve such additional voltage potentials to apply to the NW 715 and the PW 720 may also be designed in-chip or off-chip.

Figure 11:
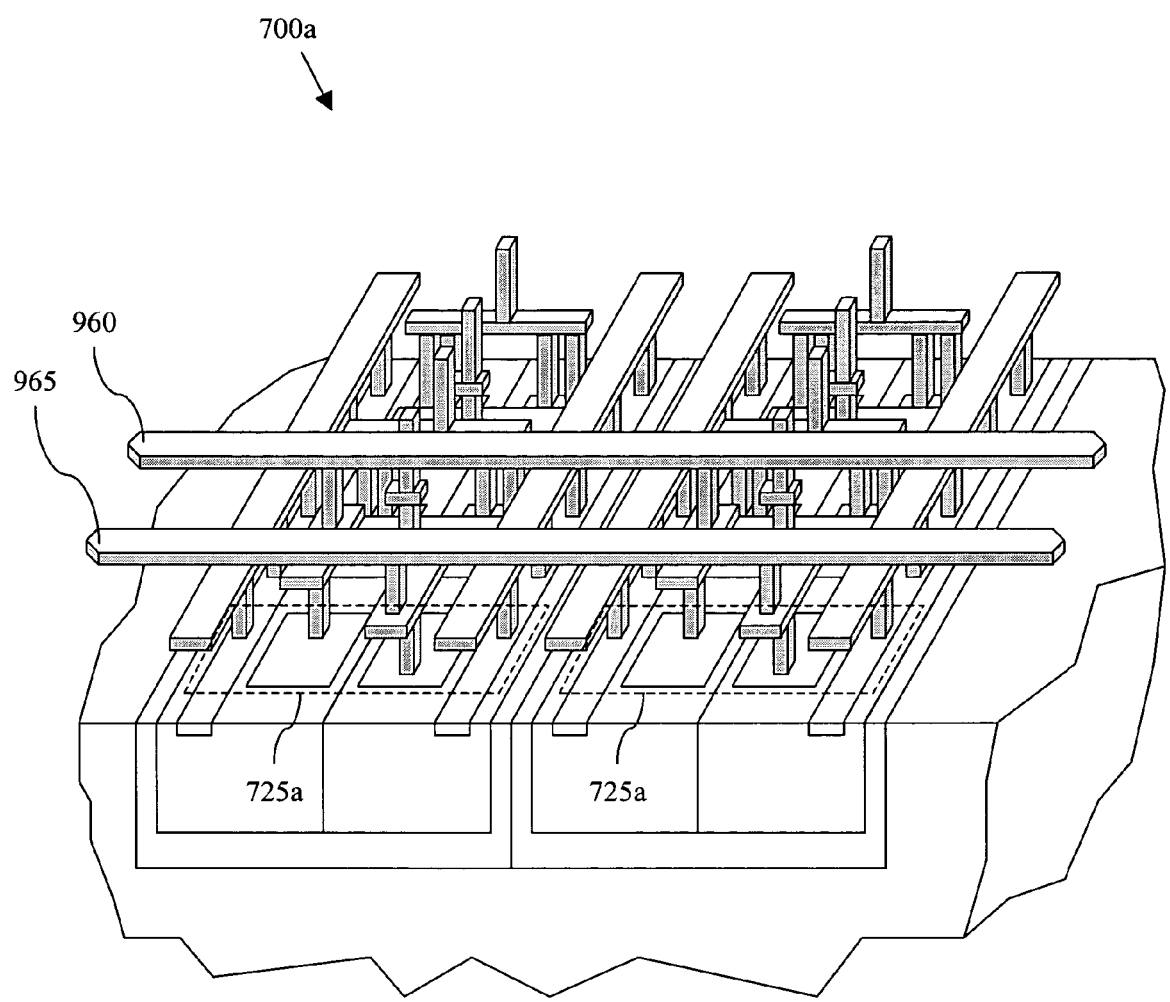
FIG. 11 is a perspective view of another embodiment of the apparatus shown in FIG. 10 according to aspects of the present disclosure.

Referring to FIG. 11, illustrated is a perspective view of at least a portion of another embodiment of the apparatus 700 shown in FIG. 10, herein designated by the reference numeral 700a. The apparatus 700a is substantially similar to the apparatus 700 shown in FIG. 10. However, while it is discussed above that the apparatus 700 may include tap cells in addition to the single tap cell formed in the single tap cell region 725 shown in FIG. 10, and may also include associated devices in addition to the devices formed in the associated device regions 730a, 730b shown in FIG. 10, the apparatus 700a shown in FIG. 11 depicts multiple tap cells 725a each corresponding to devices formed in multiple associated device regions.

In one embodiment, the multiple tap cells 725a may each be aligned with others of the tap cells 725a. For example, the tap cells 725a may be positioned in a grid-like pattern, such as where the lateral sides of each tap cell 725a are substantially aligned with the lateral sides of at least one other tap cell 725a, such that the interconnects 960, 965 employed to interconnect the tap cells 725a to each other may substantially comprise straight, elongated members extending between each neighboring, connected pair of tap cells 725a. Consequently, the interconnects 960, 965 need not require any bends or turns to interconnect neighboring pairs of tap cells 725a.

Thus, in one embodiment, apparatus constructed according to aspects of the present disclosure may include two or more sets of the interconnects 960, 965. However, in some embodiments it may not be possible or desired to align all of the tap cells included on a chip. Moreover, it may not be desirable to configure the interconnects 960, 965 to have more than one substantially elongated segment. That is, it may not be desirable to configure the interconnects 960, 965 as having one or more bends, or one or more perpendicular or otherwise angularly offset segments.

Thus, while not shown in FIG. 11, additional interconnects similar in composition, manufacture, and function to the interconnects 960, 965 may be employed in orientations that are laterally offset from the interconnects 960, 965 in a direction perpendicular to interconnects 960, 965. Such additional interconnects for providing a back-bias potential to tap cells not sufficiently aligned with the tap cells 725a may have common power supplies and or controllers as those connected to the tap cells 725a by the interconnects 960, 965. Alternatively, separate power supplies and/or controllers may be connected to the non-aligned tap cells by the additional interconnects.

Thus, the present disclosure provides an apparatus including, in one embodiment, a CMOS device cell including at least first and second CMOS transistors having first and second CMOS transistor doped regions in first and second doped wells, respectively, wherein each of the first and second CMOS transistor doped regions is configured to be biased with a corresponding one of a power supply potential and a ground potential. Such an embodiment also includes a tap cell having first and second tap cell doped regions in the first and second doped wells, respectively, wherein each of the first and second tap cell doped regions is configured to be biased with a different potential relative to the power supply and ground potentials.

Another embodiment of an apparatus introduced in the present disclosure includes a plurality of tap cells each corresponding to associated ones of a plurality of CMOS transistor devices. In such an embodiment, ones of the plurality of CMOS transistor devices are configured to be biased with at least one of a power supply potential and a ground potential. Moreover, each of the plurality of tap cells is configured to back-bias associated ones of the plurality of CMOS transistor devices with one of first and second potentials that are each a different potential relative to the power supply and ground potentials. In a related embodiment, ones of the plurality of CMOS transistor devices collectively compose a plurality of CMOS device cells, and the plurality of CMOS device cells collectively compose a plurality of CMOS device cell blocks each comprising a plurality of CMOS device cells associated with a corresponding one of the plurality of tap cells.

The present disclosure also introduces an apparatus including an N well located in a substrate, a P well located in the substrate proximate the N well, and a tap cell including an N+ doped region in the N well and a P+ doped region in the P well. A plurality of CMOS device cells included in the apparatus includes a plurality of CMOS transistor devices each having source/drain regions in a corresponding one of the N well and the P well. Power supply and ground interconnects are configured to connect the source/drain regions of ones of the plurality of CMOS transistor devices at least indirectly to a corresponding one of a power supply and ground, such that the connected source/drain regions may be biased with a corresponding one of a power supply potential and a ground potential. A first back-bias interconnect and a second back-bias interconnect are configured to connect the N well and the P well, respectively, at least indirectly to first and second back-bias sources, such that the N well and the P well may be biased with a first and second back-bias potential, respectively, that are each a different potential relative to the power supply and ground potential.

In a related embodiment, the N well is one of a plurality of N wells each located in the substrate, the P well is one of a plurality of P wells each located in the substrate, the tap cell is one of a plurality of tap cells each including an N+ doped region in a corresponding one of the plurality of N wells and a P+ doped region in a corresponding one of the plurality of P wells, and the plurality of CMOS device cells compose a plurality of cell blocks each associated with at least one of the plurality of tap cells.

The present disclosure also provides a method which may be employed, for example, to form a back-biasing architecture that may be employed with standard CMOS device cells. In one embodiment, the method includes forming an N well in a substrate, forming a P well in the substrate proximate the N well, and forming a tap cell including an N+ doped region in the N well and a P+ doped region in the P well. Such a method also includes forming a plurality of CMOS device cells each including a plurality of CMOS transistor devices each having source/drain regions in a corresponding one of the N well and the P well, as well as forming power supply and ground interconnects configured to at least indirectly connect the source/drain regions of ones of the plurality of CMOS transistor devices to a corresponding one of a power supply and ground to bias the connected source/drain regions with a corresponding one of a power supply potential and a ground potential. A first back-bias interconnect and a second back-bias interconnect may be formed and/or otherwise configured to at least indirectly connect the N well and the P well, respectively, to first and second back-bias sources to bias the N well and the P well with a first and second back-bias potential, respectively, that are each a different potential relative to the power supply and ground potential.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a CMOS device cell including at least first and second CMOS transistors having first and second CMOS transistor doped regions in first and second doped wells, respectively, wherein the first and second doped wells have opposite dopant types, and wherein each of the first and second CMOS transistor doped regions is configured to be biased with a corresponding one of a power supply potential and a ground potential; and
   a tap cell having first and second tap cell doped regions in the first and second doped wells, respectively, wherein each of the first and second tap cell doped regions is configured to be biased with a different potential relative to the power supply and ground potentials, wherein the first tap cell doped region has the same dopant type as the first doped well but a higher dopant concentration relative to the first doped well, and wherein the second tap cell doped region has the same dopant type as the second doped well but a higher dopant concentration relative to the second doped well.

2. The apparatus of claim 1 wherein the first and second tap cell doped regions are configured to be biased with different first and second potentials, respectively, that are each a different potential relative to the power supply and ground potentials.

3. The apparatus of claim 1 wherein the CMOS device cell is a standard library cell.

4. The apparatus of claim 3 wherein the tap cell and the CMOS device cell have substantially similar shapes and lateral dimensions.

5. The apparatus of claim 1 wherein at least one of magnitude and amplitude of the different potential is different relative to the power supply and ground potentials.

6. The apparatus of claim 1 wherein at least one of phase and polarity of the different potential is different relative to the power supply and ground potentials.

7. The apparatus of claim 1 wherein the first and second tap cell doped regions are configured to be biased at times in addition to when the power supply potential is biasing the corresponding one of the first and second CMOS transistor doped regions.

8. An apparatus, comprising:
an N well located in a substrate;
a P well located in the substrate proximate the N well;
a tap cell including an N+ doped region in the N well and a P+ doped region in the P well;
a plurality of CMOS device cells each including a plurality of CMOS transistor devices each having source/drain regions in a corresponding one of the N well and the P well;
power supply and ground interconnects configured to connect the source/drain regions of ones of the plurality of CMOS transistor devices at least indirectly to a corresponding one of a power supply and ground to bias the connected source/drain regions with a corresponding one of a power supply potential and a ground potential; and
a first back-bias interconnect and a second back-bias interconnect configured to connect the N well and the P well, respectively, at least indirectly to first and second back-bias sources to bias the N well and the P well with a first and second back-bias potential, respectively, that are each a different potential relative to the power supply and ground potential.

9. The apparatus of claim 8 further comprising an interconnect structure including first and second metal layers having a plurality of conductive members interconnecting ones of the plurality of CMOS transistor devices to form ones of a plurality of CMOS device cells included in the apparatus, wherein the power supply and ground interconnects each at least partially include one of the plurality of conductive members in the first metal layer, and wherein the first and second back-bias interconnects each at least partially include one of the plurality of conductive members in the second metal layer.

10. The apparatus of claim 8 wherein the power supply and ground interconnects are substantially parallel, and wherein the first and second back-bias interconnects are substantially parallel and each substantially perpendicular to the power supply and ground interconnects.

11. The apparatus of claim 8 wherein:
the N well is one of a plurality of N wells each located in the substrate;
the P well is one of a plurality of P wells each located in the substrate;
the tap cell is one of a plurality of tap cells each including an N+ doped region in a corresponding one of the plurality of N wells and a P+ doped region in a corresponding one of the plurality of P wells; and
a plurality of CMOS device cells included in the apparatus collectively compose a plurality of cell blocks each associated with at least one of the plurality of tap cells.

12. The apparatus of claim 11 wherein each of the plurality of tap cells is oriented proximate a perimeter of a corresponding one of the plurality of cell blocks.

13. The apparatus of claim 11 wherein each of the plurality of tap cells is oriented in a central portion of a corresponding one of the plurality of cell blocks.

14. The apparatus of claim 8 wherein the N well and the P well are electrically isolated from the substrate.

15. The apparatus of claim 14 wherein a deep doped well electrically isolates the N well and the P well from the substrate.

16. The apparatus of claim 8 further comprising an isolation structure interposing the N well and the P well in the substrate.

* * * * *